United States Patent
Mizuno et al.

[11] Patent Number: 5,554,806
[45] Date of Patent: Sep. 10, 1996

[54] PHYSICAL-QUANTITY DETECTING DEVICE

[75] Inventors: Naohito Mizuno, Kariya; Shinichi Hirose, Nukata-gun; Hiromi Ariyoshi, Kariya; Yasuki Shimoyama, Nukata-gun, all of Japan

[73] Assignee: Nippondenso Co., Ltd., Kariya, Japan

[21] Appl. No.: 477,614

[22] Filed: Jun. 7, 1995

[30] Foreign Application Priority Data

Jun. 15, 1994 [JP] Japan ................................. 6-132996
Mar. 23, 1995 [JP] Japan ................................. 7-063730

[51] Int. Cl.⁶ ................................................ G01P 1/02
[52] U.S. Cl. ................................................ 73/493
[58] Field of Search ........................... 248/27.1; 73/493, 73/756, 431, 855, 204.22, 514.01, 514.36, 514.37, 514.16; 180/282

[56] References Cited

U.S. PATENT DOCUMENTS 5,233,871  8/1993  Schwarz ................................. 73/493

FOREIGN PATENT DOCUMENTS 53-142887  12/1978  Japan.
54-13782   2/1979   Japan.
62-174978  7/1987   Japan.
4131723    5/1992   Japan.
5-36992    2/1993   Japan.
5231975    9/1993   Japan.

OTHER PUBLICATIONS

Terry: "A Minature Silicon Accelerometer with Built–in Damping", IEEE Solid–State Sensors & Actuators Workshop, Jun. 8, 1988, pp. 1–4.

Primary Examiner—Hezron E. Williams
Assistant Examiner—Christine K. Oda
Attorney, Agent, or Firm—Cushman, Darby & Cushman

[57] ABSTRACT

An acceleration detecting device, which can be constructed simply and allow compactness, is disclosed. A cover is installed on a housing-body portion to form a hollow portion, and a sensor chip which is subjected to acceleration and displaced is bonded and fixed within this hollow portion. This housing-body portion has a flat end face, and electrical wiring leads and electrically connected to the sensor chip is formed on the end face via the interior of the housing-body portion. This end face is electrically and mechanically connected to a circuit board by a bonding agent, and the housing-body portion is fixed to the circuit board substantially perpendicularly.

20 Claims, 13 Drawing Sheets

PHYSICAL-QUANTITY DETECTING DEVICE

CROSS REFERENCE TO RELATED APPLICATION

This application is based upon and claims the benefit of priority of the prior Japanese Patent applications No. 6-132996 filed on Jun. 15, 1994 and No. 7-63730 filed on Mar. 23, 1995, the contents of which are incorporated herein by reference.

BACKGROUND OF THE INVENTION

1. Field of the Invention

The present invention relates to a physical-quantity detecting device provided with a sensor chip which is subjected to action of force and outputs a corresponding signal. The physical-quantity detecting device according to the present invention can be applied, for example, in a semiconductor-type acceleration detecting device which is subjected to acceleration and detects the applied acceleration by a displacement of a cantilever formed on a silicon substrate.

2. Related Arts

Figure 13A:
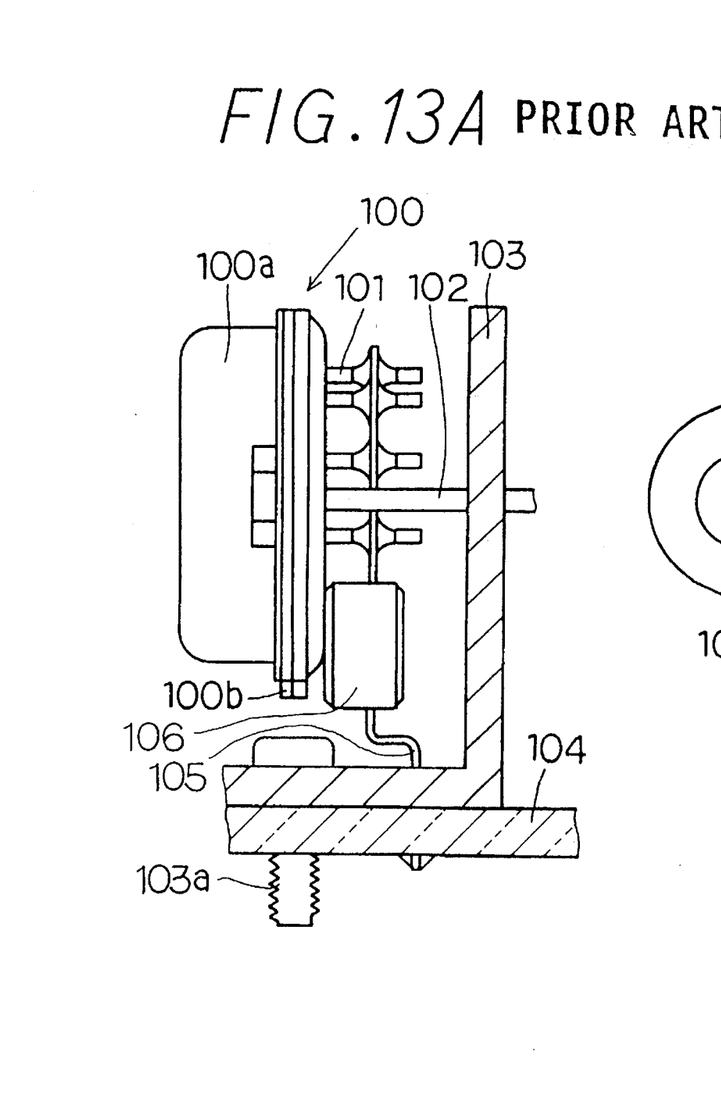
FIG. 13A is a sectional side view and FIG. 13B is a plan view of a housing 100 with a cover 100a removed.
Figure 13B:
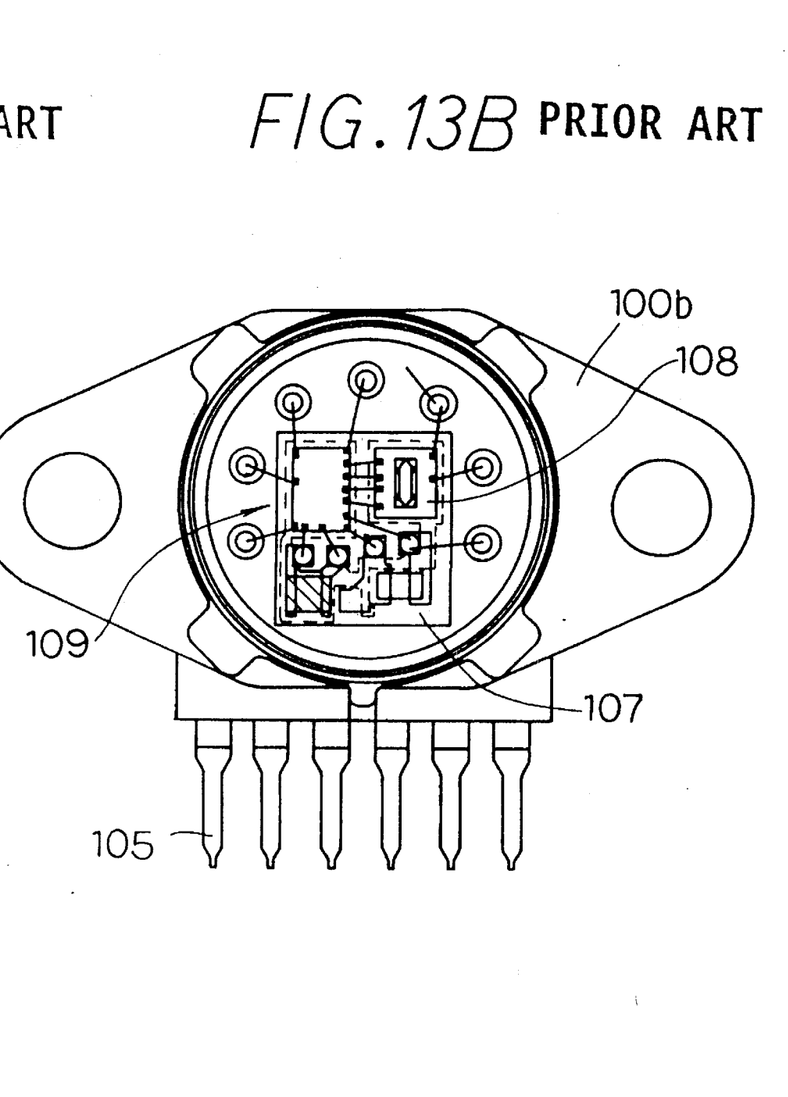

A conventional structure of an acceleration detecting device is indicated in FIGS. 13A and 13B.

FIG. 13A is a sectional side view of an acceleration detecting device having a housing 100 in which a cover 100a is formed interiorly with a hollow portion. A sensor chip to detect acceleration, processing circuit and the like are housed within the hollow portion thereof. This housing 100 has a cover 100 for fixing use having screw holes, and is fixed to a fixing plate 103 by screws 102. The fixing plate 103 has an L-shaped configuration and is fixed to a circuit board 104 by a screw 103a. Consequently, the housing 100 comes to be mechanically fixed substantially perpendicularly to the circuit board 104 via the fixing plate 103.

Furthermore, the housing 100 has a terminal 101 connected with electrical circuitry disposed in an interior thereof. This terminal 101 is connected to an output terminal 105 which is soldered to the circuit board 104 and electrically connected to wiring on the circuit board 104. The output terminal 105 is positioned and fixed by a molded-resin portion 106.

FIG. 13B indicates a plan structure of the housing 100 with the cover 100a detached. As shown in FIG. 13B, a processing circuit 109 composed of chip components such as a sensor chip 108, processor chip, resistor, and capacitor is formed on a ceramic substrate 107 within the housing 100. This processing circuit 109 detects displacement due to acceleration of the sensor chip 108 and outputs an acceleration signal. This acceleration signal is sent via the terminal 101 and output terminal 105 to an ECU (Electrical Control Unit, not illustrated) on the circuit board 104, and is employed to control an airbag or the like.

Figure 14:
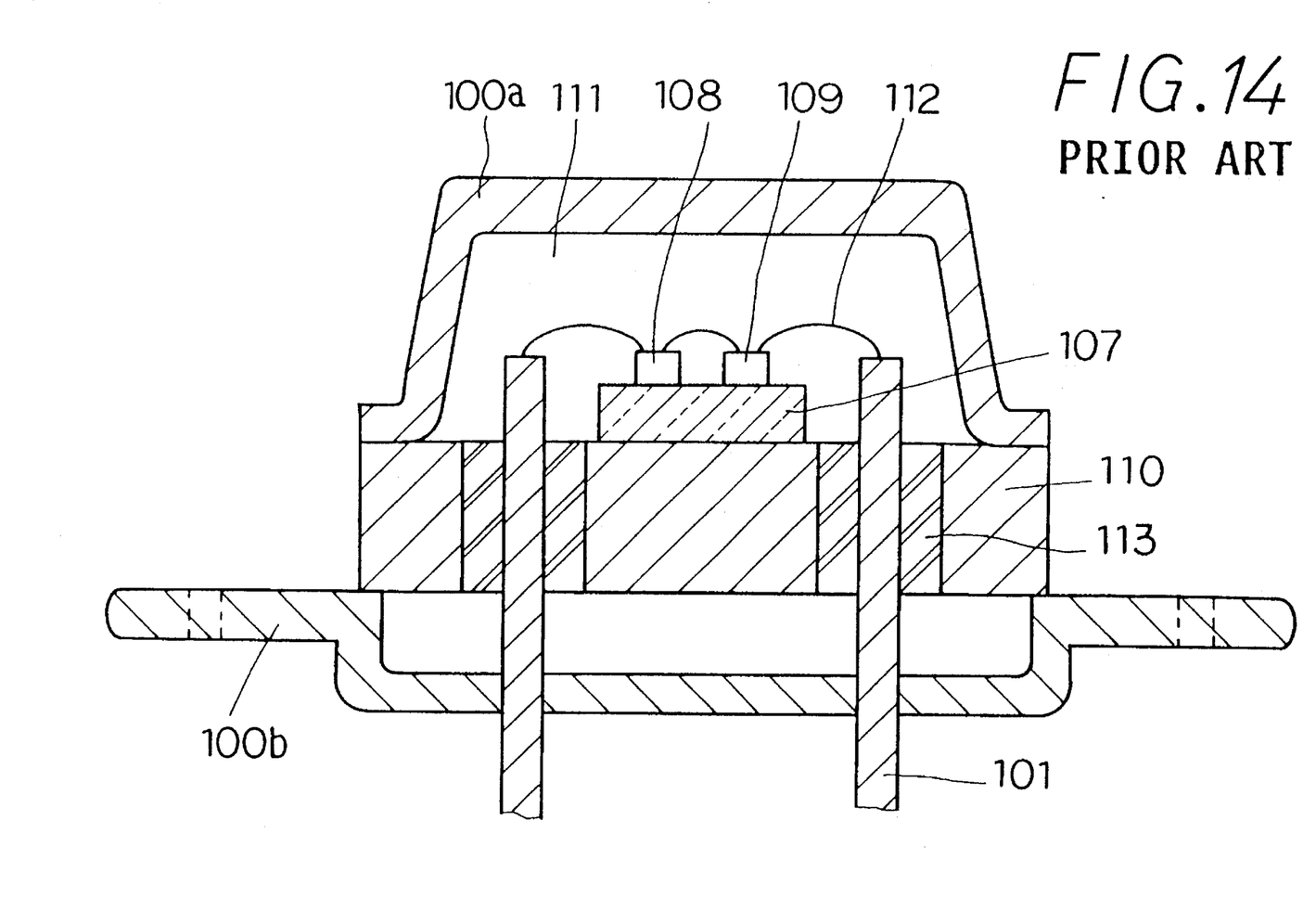
FIG. 14 is a schematic sectional view of the housing 100 shown in FIG. 13A.

FIG. 14 indicates a structural sectional schematic of the foregoing housing 104. The ceramic substrate 107 is fixed by adhesive to a stem 110, and the sensor chip 108 and processing circuit 109 are formed on this ceramic substrate 109. A metallic cover 100a is installed by welding on a front side of the stem 100, airtightly sealing a hollow portion 111. Additionally, a metallic cover 100b is installed by welding on a rear side. The sensor assembly is structured thereby.

The terminal 101 and the sensor chip 108 and processing circuit 109 are wire-bonded by wires 112 and electrically connected with an exterior. The terminal 101 is hermetically sealed with respect to the step 110 by low-melting glass 113, and the cover 100a is welded to the stem 110 and the housing 100 interior is airtightly sealed.

Because the circuit board 104 indicated in FIG. 13A is installed on a plane parallel to a floor of a vehicle passenger compartment, the housing is installed via the fixing plate 103 substantially perpendicularly to the circuit board 104 so that the sensor chip 108 comes to be substantially perpendicular with respect to the circuit board 104.

With the conventional acceleration detecting device, there exists the problem wherein the components are many and structure as well is large and complex, and consequently the number of fabrication steps is also large.

That is to say, in the above-described conventional structure, the cover 100a, stem 110, and terminal 101 are provided as the structure of the portion to seal airtightly. Furthermore, disposal of the fixing plate 103 fixed substantially perpendicularly to the circuit board 104 as well as the cover for fixing use 100b and screw 102 for fixing by screw thereto are required to connect the housing 100 substantially perpendicularly with respect to the circuit board 104. Moreover, through-holes for solder use are required for the output terminal 105 and circuit board 104 to electrically connect the circuit board 104 and the acceleration detecting device.

SUMMARY OF THE INVENTION

In light of the foregoing problems, it is an object of the present invention to form a physical-quantity detecting device such as an acceleration detecting device permitting simplicity and compactness.

To attain the foregoing object, a physical-quantity detecting device according to the present invention has a housing fixed on a circuit board and having a hollow portion, and a sensor chip installed within the hollow portion to be subjected to force in a direction perpendicular or parallel to the circuit board to output an electrical signal in correspondence with a magnitude of the force, and is characterized in that: the housing has a flat end face on an outer side thereof; a wiring electrode to output the electrical signal is provided so as to be drawn from a wall of the hollow portion to the flat end face penetrating the housing; the wiring electrode has a face-bonding pad region on the flat end face; and the face-bonding pad region of the wiring electrode is electrically and mechanically connected to wiring on the circuit board when the housing is fixed to the circuit board.

It is possible to form the housing to have a mount portion for chip-support use wherein a portion on which the sensor chip is installed is parallel or perpendicular with respect to the end face; and a cover installed on an installation side of the chip with respect to the mount portion, thereby forming the hollow portion and airtightly sealing this hollow portion.

The housing may be made to laminate a plurality of insulating substrates at a mount thereof so as to structure a configuration thereof.

Additionally, The face-bonding pad region of the wiring electrode provided on the end face of the housing and wiring of the circuit board may be face-bonded and electrically connected using a conductive bonding agent.

Furthermore, it is also possible to employ wires, instead of face-bonding, to electrically connect the face-bonding pad region of the wiring electrode to wiring of the circuit board. In that case, it is preferred that a wire-bonding surface, i.e., the surfaces of the face-bonding pad region of the wiring electrode and wiring of the circuit board, be established in a substantially identical plane.

According to the present invention, a sensor chip is installed within a hollow portion of a housing. An electrical signal indicating a displaced state of this sensor chip is output to an outer portion by wiring electrode formed within the housing as well as on a flat end face. The end face of the housing is electrically and mechanically connected to a circuit board, and the housing is thereby fixed substantially perpendicular to or in parallel with the circuit board and the electrical signal is output to the circuit board.

Consequently, because the housing having the flat end face is electrically and mechanically connected and fixed to the circuit board, a fixing plate required in the conventional detecting device is not required, and because the electrical and mechanical connections are performed at one location, a structure which is simple in comparison with the conventional detecting device can be obtained.

BRIEF DESCRIPTION OF THE DRAWINGS

These and other objects, features and characteristics of the present invention will be appreciated from a study of the following detailed description, the appended claims, and drawings, all of which form a part of this application, in which:

FIGS. 2A to 2E indicate a structure of the housing-body portion 2 shown in FIG. 1, wherein

FIGS. 12A to 12E indicate a structure of the housing-body portion 2 shown in FIGS. 11A and 11B, wherein

FIGS. 13A and 13B indicate a conventional structure of an acceleration detecting device, wherein

DETAILED DESCRIPTION OF THE PRESENTLY PREFERRED EXEMPLARY EMBODIMENTS

First Embodiment

Figure 1:
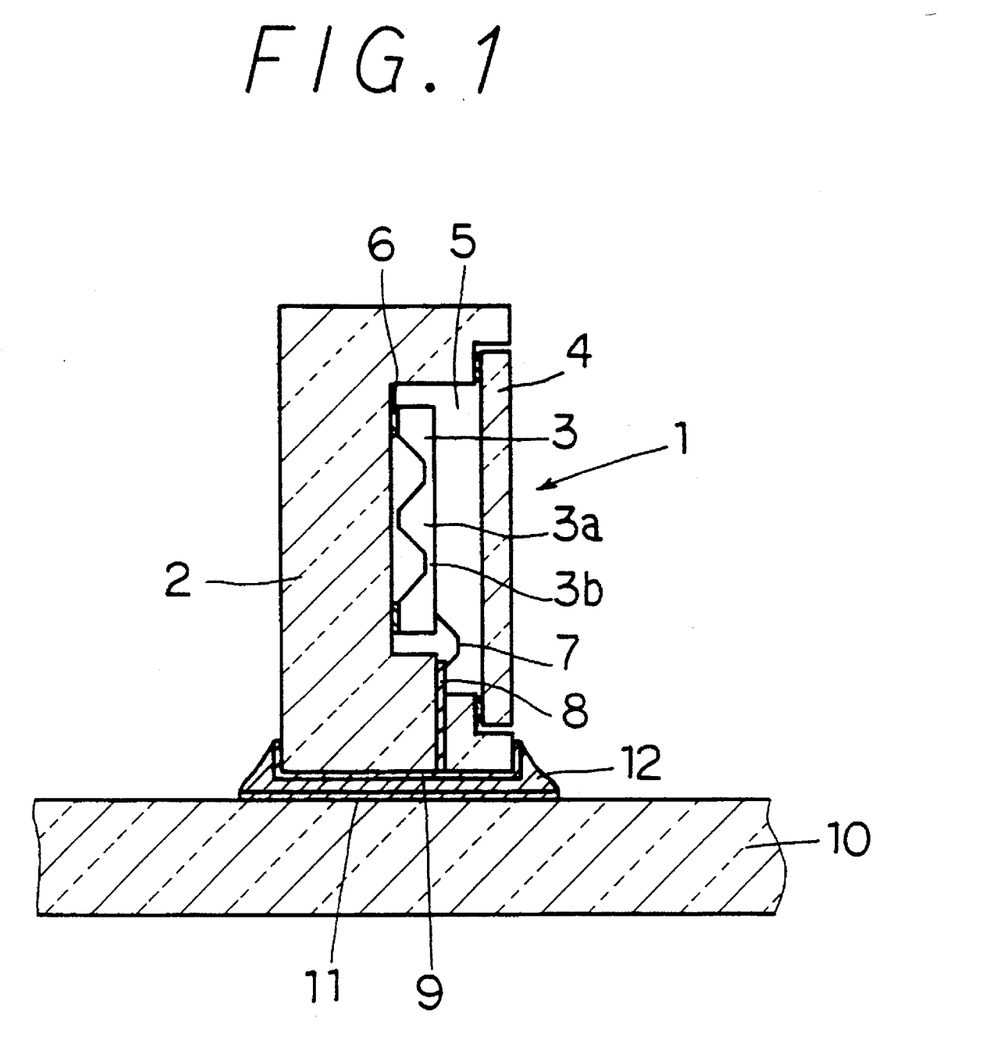
FIG. 1 is a sectional structural view indicating a first embodiment according to the present invention.

FIG. 1 indicates a sectional side structural view of an acceleration sensor (hereinafter termed a "G sensor") 1 of an acceleration detecting device.

The G sensor 1 is structured from a housing-body portion 2, sensor chip 3, cover 4, and the like and, as shown in FIG. 1, is mounted perpendicularly with respect to a circuit board 10. The housing-body portion 2 and cover 4 form a housing. On the circuit board 10, other circuit elements (not shown) are mounted.

The housing-body portion 2 is of a box configuration having a concavity formed by laminating a plurality of sheets of an insulator substrate of ceramic, glass, or the like, and has a hollow portion 5 to house the sensor chip 3 and the like. This hollow portion 5 is airtightly sealed by bonding and fixing the cover 4 composed of ceramic material to the housing-body portion 2 by solder, low-melting glass, adhesive, or the like. This cover 4 is provided to protect the sensor chip 3 from external water, steam, etc. The cover can also be formed of an insulator such as glass or of metal instead of ceramic material.

The sensor chip 3 is bonded and fixed to an inner surface of the housing-body portion 2 by a die-bond agent 6. This sensor chip 3 has a cantilever composed of a weight 3a and thin portion 3b formed in monocrystalline silicon substrate, and displacement of the weight 3a is detected by a strain gauge disposed on the thin portion 3b. This strain gauge is of a known bridge structure and acceleration detection is performed by a processing circuit. The processing circuit is not shown in FIG. 1, but is formed on a surface in the housing-body portion 2 on which the sensor chip 3 is formed.

Additionally, wiring leads 8 and 9 for external electrical connection are formed on an inner and outer wall of the housing-body portion 2. The wiring lead 8 is electrically connected by wire bonding employing a wire 7 or aluminum, gold, or the like to wiring-output pads disposed respectively on the sensor chip 3 and the processing circuit (not illustrated), and is electrically connected through the interior of the housing-body portion 2 to wiring lead 9 formed on the end face, upper surface, and lower surface of the housing-body portion 2. It is also acceptable to structure the wiring lead 8 by forming via-holes within the substrate as shown in the embodiment indicated in FIG. 7 which will be described later.

On the circuit board 10, the G sensor 1 and circuit elements (not shown), all of which make up an ECU, are mounted simultaneously by causing a bonding agent 12, such as solder, silver paste, or the like, to reflow. Herein, the wiring lead 9 formed on the housing-body portion 2 and wiring 11 (circuit wiring connected to the foregoing circuit elements) formed on the circuit board 10 are electrically connected via the bonding agent 12 so that the G sensor 1 is face-down bonded and fixed substantially perpendicular to the circuit board 10. Consequently, the G sensor 1 is electrically and mechanically connected by the bonding agent 12 to the circuit board 10.

According to the above-described structure, the G sensor 1 can be mounted substantially perpendicularly with respect to the circuit board 10.

Furthermore, the foregoing embodiment differs from conventional devices in structuring the housing-body portion 2 and cover 4 of ceramic material. In such structure, adequate noise countermeasures can be performed by providing an amplifier to counter noise in the processing circuit within the G sensor 1 and also providing a filter for noise-removal in a circuit on the circuit board 10.

FIGS. 2A to 2E indicate the structure of the housing-body portion 2. FIGS. 2A to 2E indicate respectively the upper surface, front surface, lower surface, side surface, and rear surface of the housing-body portion 2. As shown in these drawings, the hollow portion 5 is formed in the housing-body portion 2, and the sensor chip 3, etc., are formed on a surface A of this hollow portion 5.

Figures 2A, 2B, 2C, 2D:
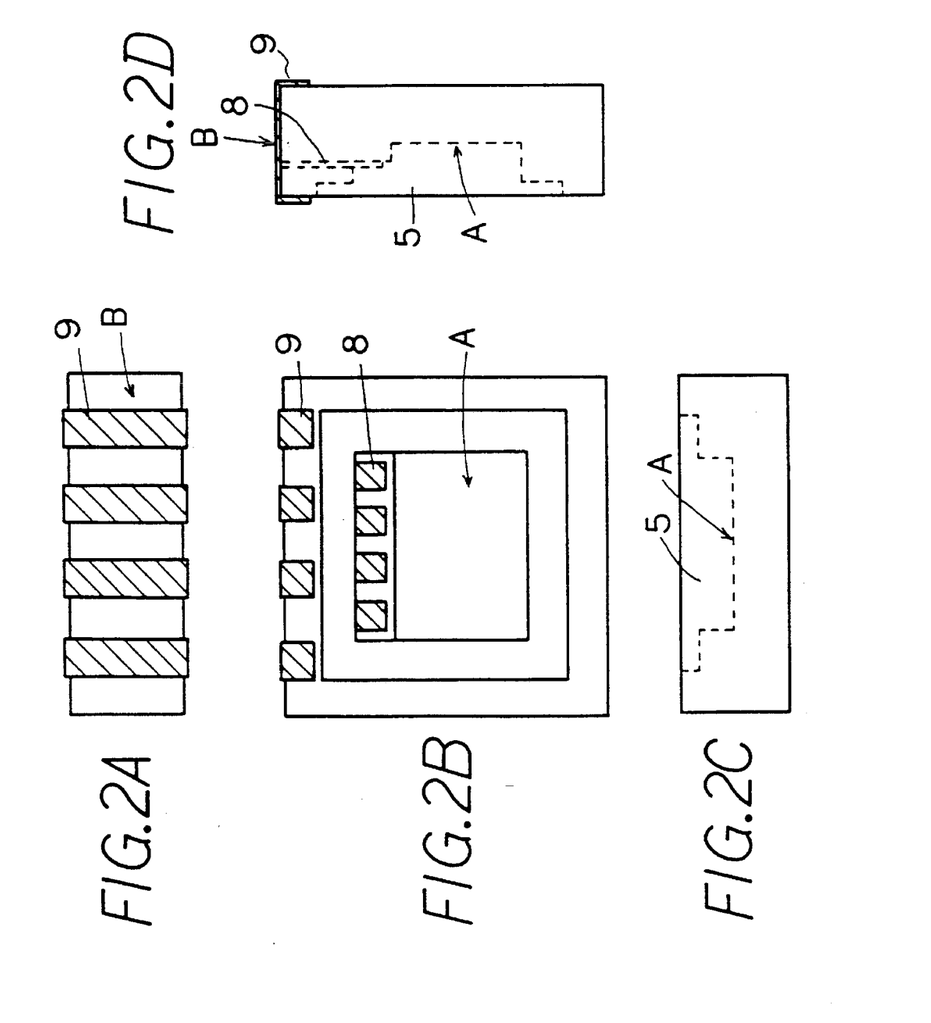
FIG. 2A is a top view.
FIG. 2B is a front view.
FIG. 2C is a bottom view.
FIG. 2D is a side view.
Figure 2E:
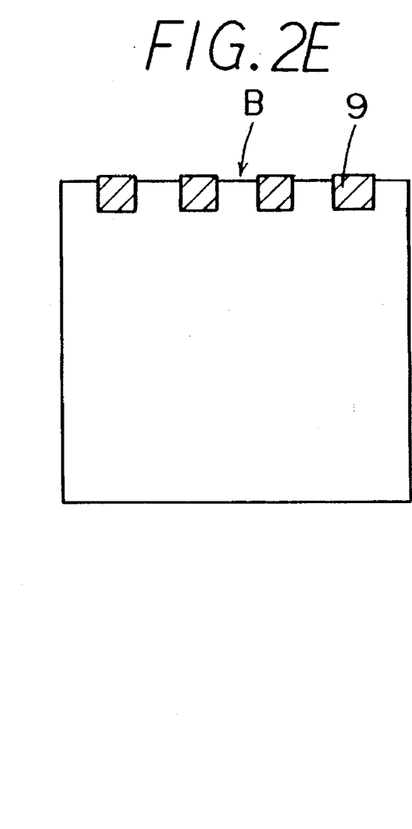
FIG. 2E is a rear view.

Additionally, wiring lead 8 is formed within this housing-body portion 2, and wiring lead 9 is formed on the upper surface of housing-body portion 2 indicated in FIG. 2A (the end face of the invention, hereinafter termed "surface B") and on the front surface and a portion of the back surface. This surface B is connected to the circuit board 10 via the bonding agent 12, and the wiring lead 9 is electrically connected to the wiring 11 on the circuit board 10.

The housing-body portion 2 is formed by laminating substrates which have undergone punching. A method of fabrication for this will be described hereinafter with reference to FIGS. 3A to 3F.

Figure 3A:
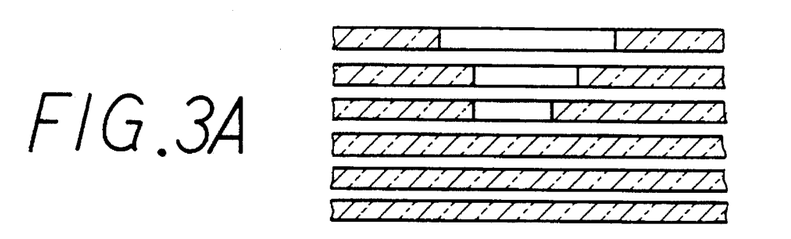
FIGS. 3A to 3F are process diagrams indicating a fabrication process of the housing-body portion 2.
Figure 4:
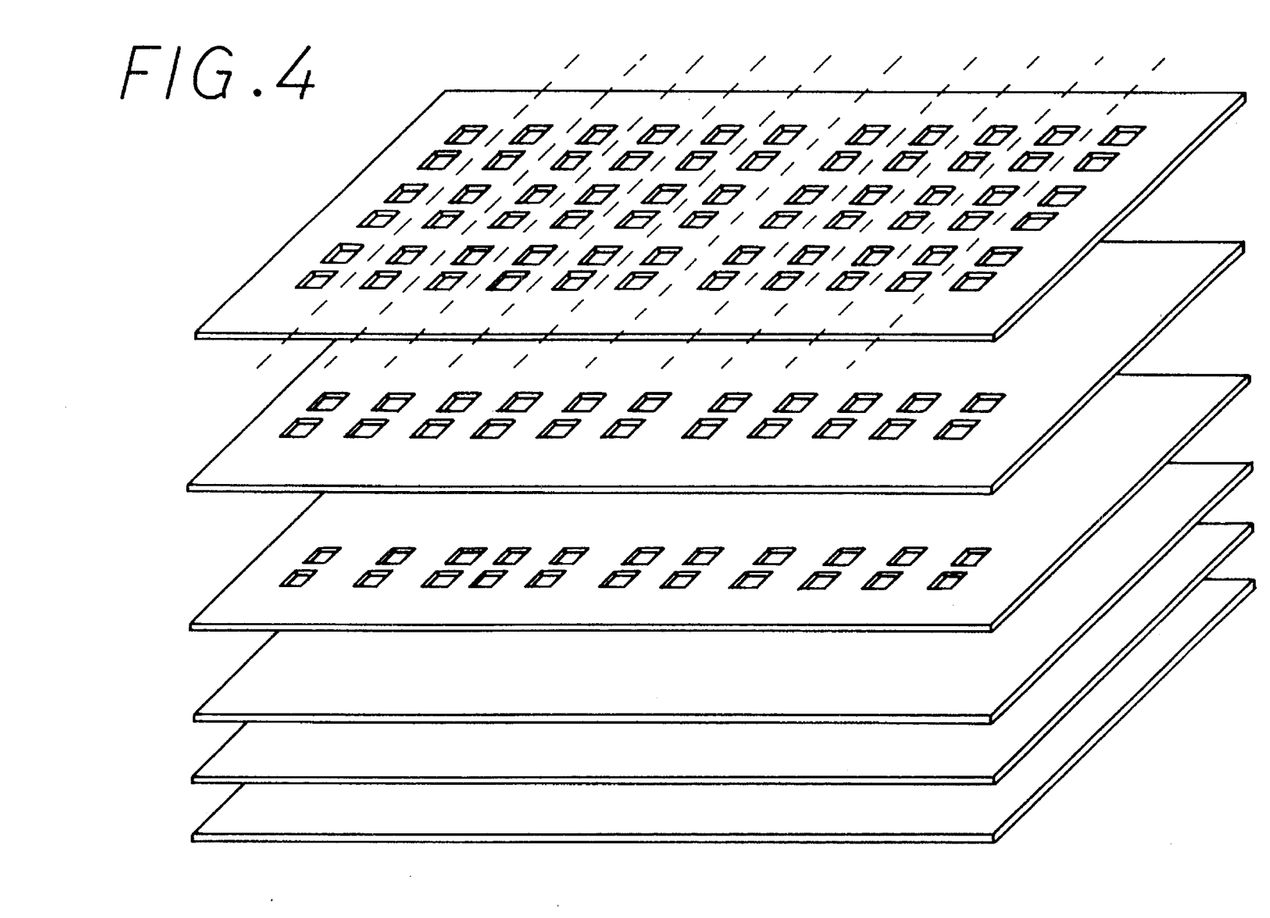
FIG. 4 is a perspective view indicating six sheets of substrate structuring the housing-body portion 2.

Six sheets of a substrate composed of an insulator such as ceramic, glass or the like are prepared (the number of laminations is determined by the size of the housing, the scale of the circuitry, and so on), and punching is performed for the upper three sheets thereof as shown in FIG. 3A. With these six sheets of substrate, a multiplicity of hole-punching is performed for one sheet of substrate as shown in FIG. 4 to form multiple housing-body portions at one time.

Figure 3B:
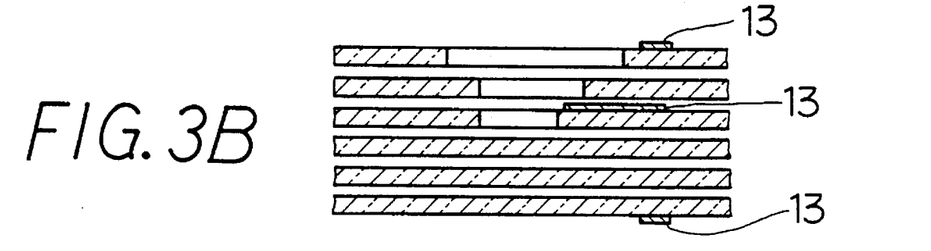
Figure 3C:
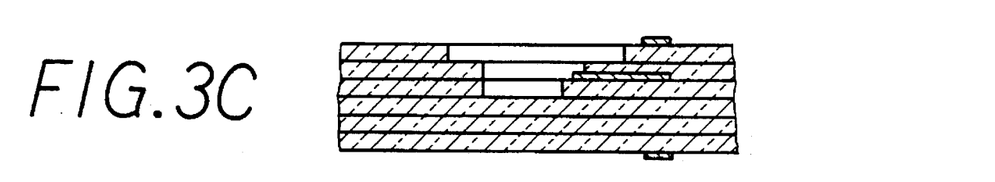
Figure 3D:
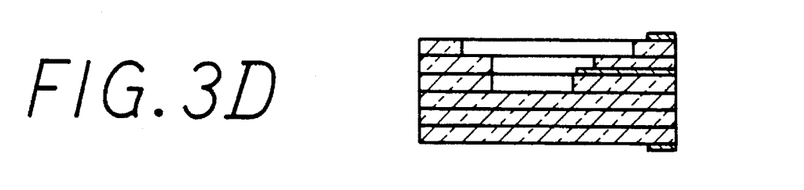

Accordingly, as shown in FIG. 3B, a conductor paste 13 is printed at predetermined locations, and these are laminated and compressed (FIG. 3C). Next, cutting is performed with a cutter or the like as shown in FIG. 3D. This cutting is performed in the vertical direction of FIG. 4, i.e., in the direction indicated by dotted lines in FIG. 4.

Figure 3E:
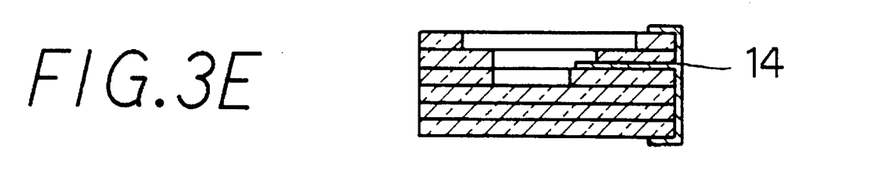

Thereafter, as shown in FIG. 3E, conductor paste 14 is printed on the side surface which will become surface B so as to be connected with the conductor paste 13 formed previously. Thereafter, firing is performed, plating with copper or nickel or gold is performed (FIG. 3F), cutting in the horizontal direction is performed with a cutter or the like, and one housing-body portion 2 is structured.

Figure 3F:
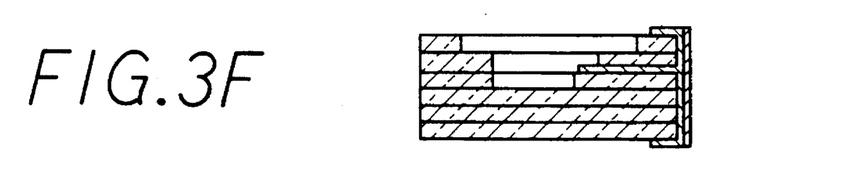

The conductor pastes 13 and 14 form the wiring leads 8 and 9.

The sensor chip 3 and the like are bonded and fixed within the hollow portion 5 with respect to this housing-body portion 2, and the cover 4 is bonded and fixed to the front surface of the housing-body portion 2. Thereafter, as shown in FIG. 1, the end face of the housing-body portion 2 is face-down bonded to be fixed substantially perpendicularly to the circuit board 10 by the bonding agent 12.

The degree of perpendicularity of the G sensor 1 and circuit board 10 is determined by the dimensional accuracy of the housing-body portion 2. The degree of parallelization of surface A is formable to 0.5° or less. The degree of perpendicularity of surface B is determined by the accuracy of the cutter or the like which cuts surface B, and can be machined with a precision of 0.5° or less. Consequently, the G sensor 1 can be fixed substantially perpendicularly to the circuit board 10 with an overall tilt of 1° or less.

According to the foregoing embodiment, conductor paste 14 is printed on the end face after cutting the laminated substrates, as shown in FIGS. 3D and 3E, but it is also acceptable to first form the conductor paste utilizing via-holes so that vertical and horizontal substrate cutting can be performed in the same step.

Figure 5A:
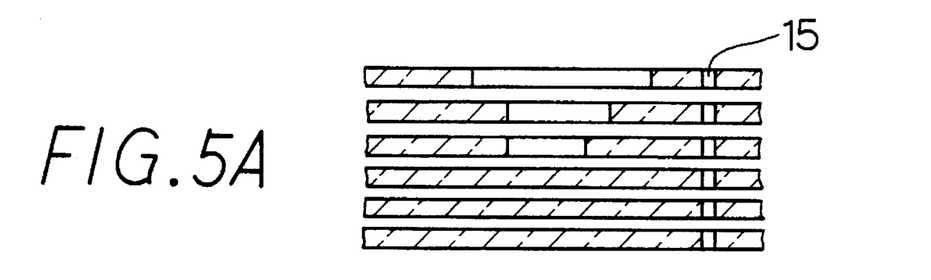
FIGS. 5A to 5E are process diagrams indicating another fabrication process of the housing-body portion 2.
Figure 5B:
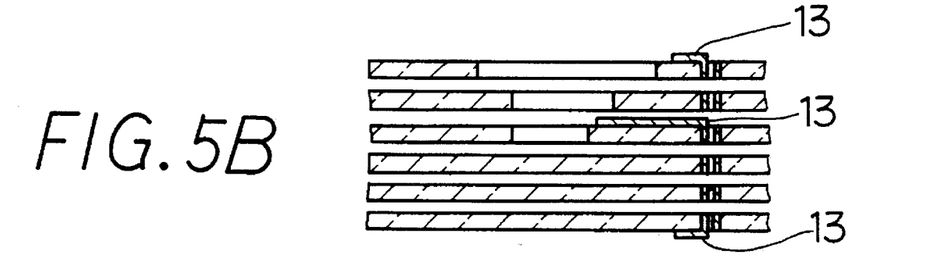

That is to say, as shown in FIG. 5A, via-holes 15 are formed in the respective substrates along with substrate punching, and in the step shown in FIG. 5B the via-holes 15 are filled with conductor paste simultaneously with printing the conductor paste 13 on the substrate, similar to FIG. 3B.

Figure 5C:
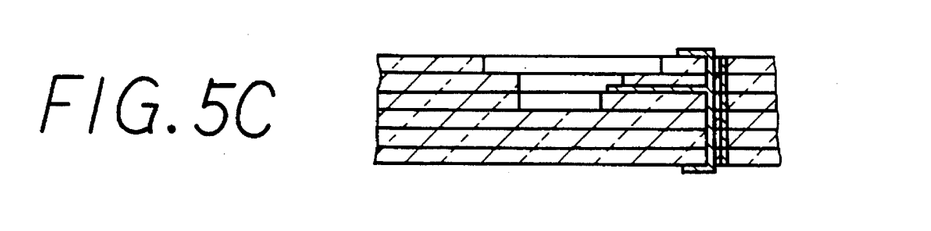
Figure 5D:
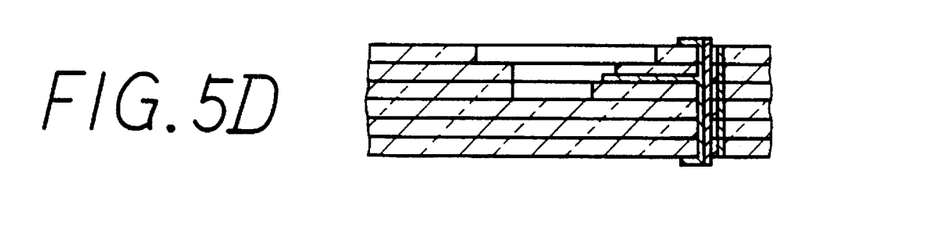
Figure 5E:
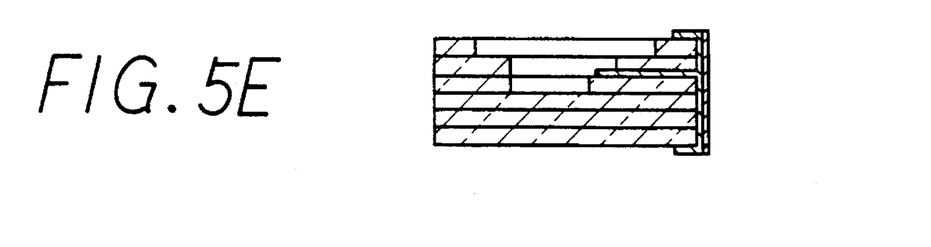

Thereafter, as shown in FIG. 5C, the respective substrates are laminated and compressed and co-fired, and then plating is performed as shown in FIG. 5D. Thereafter, cutting is performed with a cutter or the like as shown in FIG. 5E. This cutting is performed in the vertical direction (direction indicated by dotted lines in FIG. 4) as well as in the horizontal direction.

In this arrangement, because the wiring lead 9 is provided by utilizing via-holes, the vertical and horizontal cutting can be performed in the same step, and a large quantity of housing-body portions 2 can be fabricated in one batch.

Second Embodiment

Figure 6:
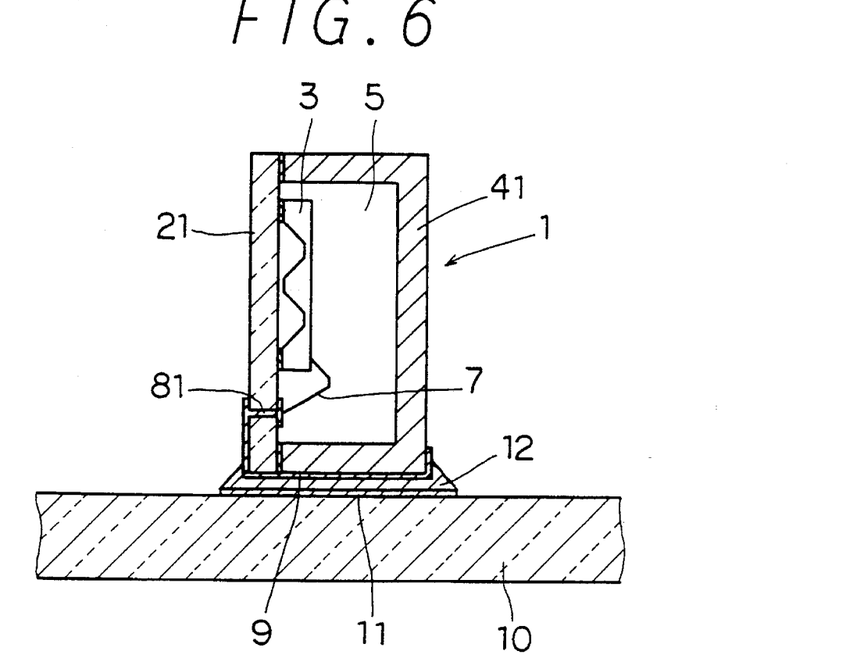
FIG. 6 is a sectional structural view indicating a second embodiment according to the present invention.

According to the present embodiment, the structure of the housing is modified with respect to the foregoing first embodiment. According to the present embodiment, as shown in FIG. 6, a substrate 21 of planar configuration is employed and a hollow portion is present on a cover 41 side. The cover 41 is a metallic article of a configuration having a concavity, and is bonded and fixed to one surface side of the substrate 21. The hollow portion 5 housing the sensor chip 3 is formed thereby, and along with this, the interior of this hollow portion 5 is airtightly sealed. Additionally, thickness in the width direction can be made larger by the cover 41 of concavity configuration, and stability when bonded to the circuit board 10 can be made favorable.

According to the present embodiment, a via-hole is formed in the substrate 21, and wiring lead 81 is formed in this via-hole to be connected with the wiring lead 9 formed on the end face.

Additionally, the cover 41 can also be structured of ceramic, glass, or the like instead of metal.

Third Embodiment

Figure 7:
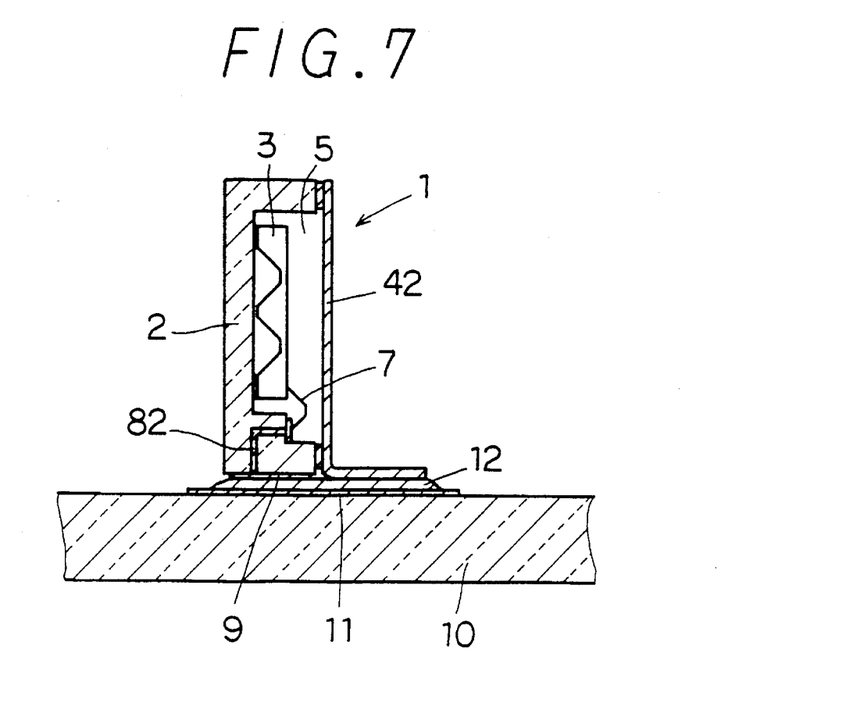
FIG. 7 is a sectional structural view indicating a third embodiment according to the present invention.

The present embodiment employs a metallic L-shaped cover 42, as shown in FIG. 7. By employing this cover 42 of L-shaped structure, the stability of the G sensor 1 when fixed to a circuit board 10 can be made favorable, and as a result the thickness of the housing-body portion 2 can be made thinner.

The housing-body portion 2, similarly to the first embodiment, is formed by laminating a plurality of insulator substrates. Wiring lead 82 is formed through a via-hole within the housing-body portion 2, and this wiring lead 82 is connected to the wiring lead 9 formed on the end face.

This L-shaped cover 42 can also be structured of ceramic, glass, or the like instead of metal.

Fourth Embodiment

Figure 8:
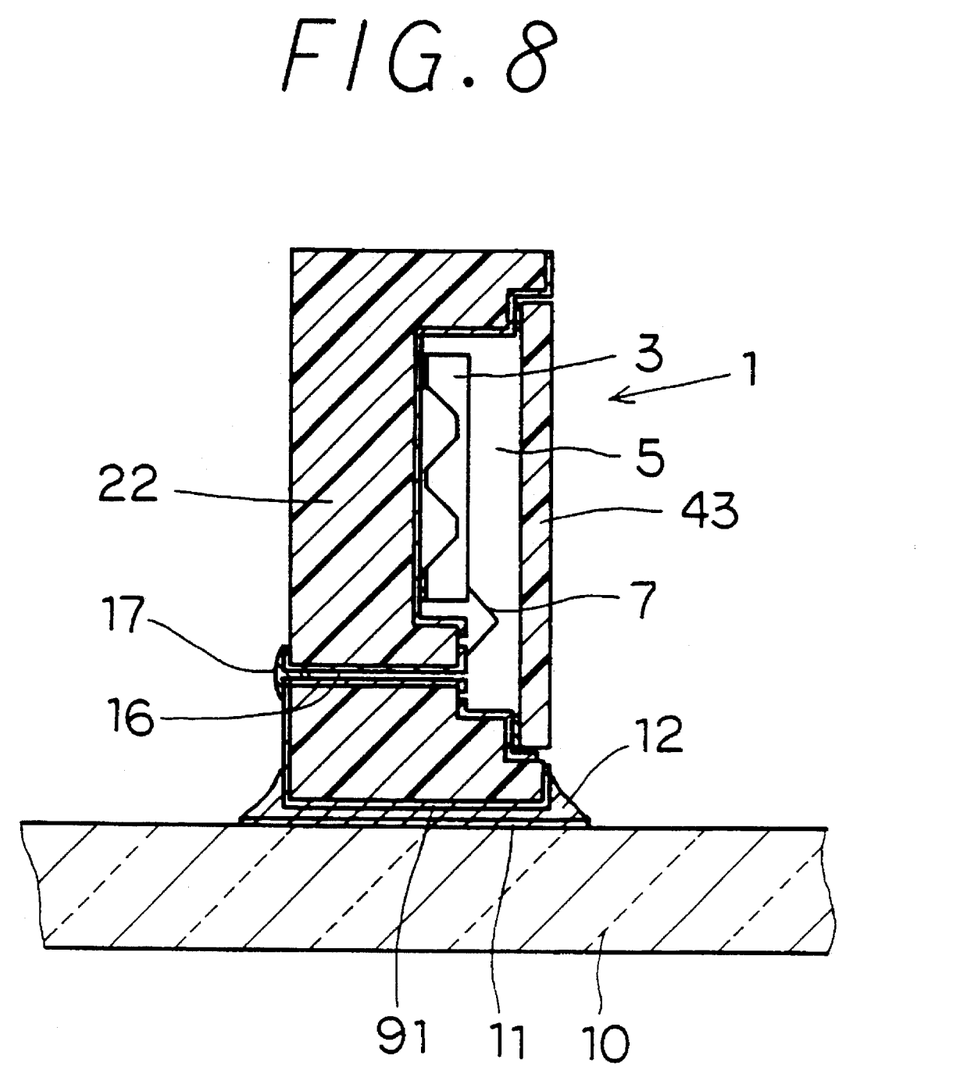
FIG. 8 is a sectional structural view indicating a fourth embodiment according to the present invention.

The present embodiment is formed by molding resin as shown in FIG. 8, without employing a laminated substrate in a housing-body portion 2. A liquid-crystal polymer or the like with a small moisture-permeability ratio can be employed as this resin. Additionally, a cover 43 is also structured of resin in consideration of the thermal-expansion coefficient with a resin housing-body portion 22.

Figures 9A, 9B:
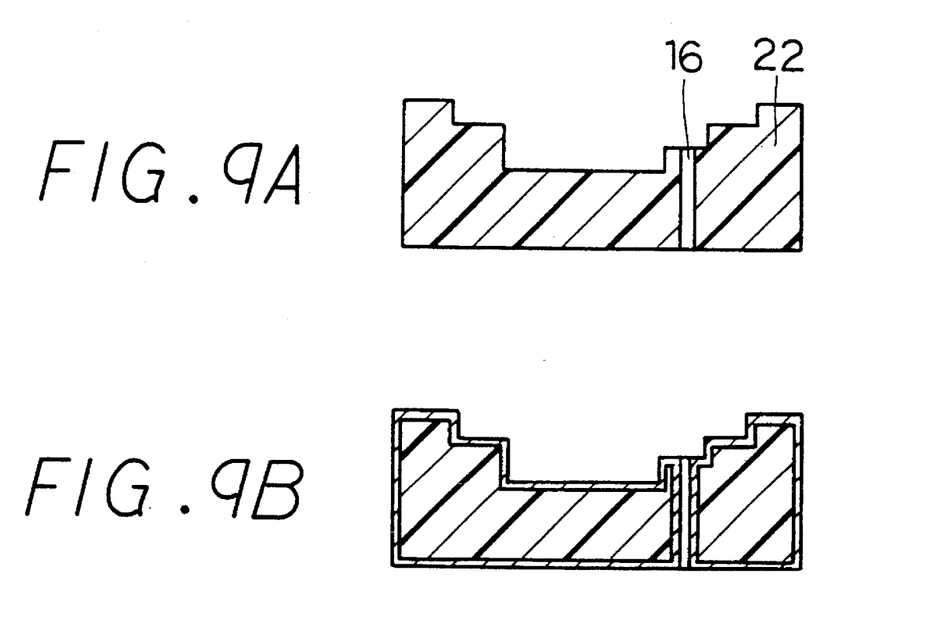
FIGS. 9A to 9D are process diagrams indicating a fabrication process of the housing-body portion 22 shown in FIG. 8.
Figure 9C:
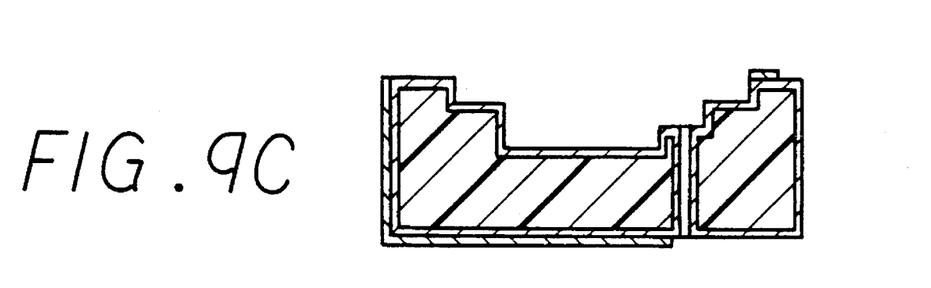
Figure 9D:
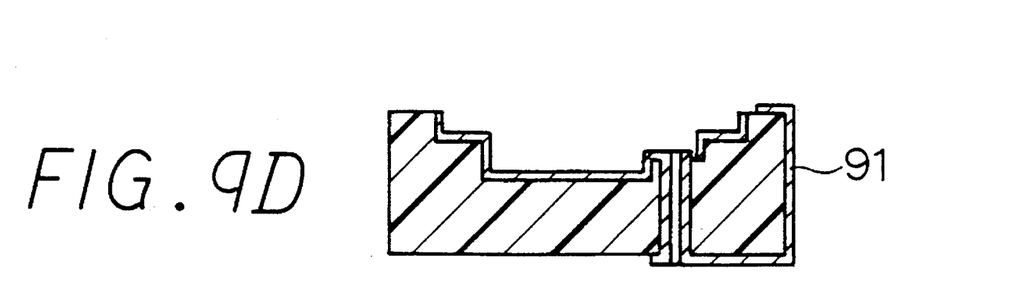

A method of fabrication of this resin housing-body portion 22 is indicated in FIGS. 9A to 9D. After resin employing a liquid-crystal polymer is insert-molded as shown in FIG. 9A, a via-hole 16 is formed. Plating of copper or nickel or gold is performed over all surfaces of this molded resin as shown in FIG. 9B, and thereafter, as shown in FIG. 9C, resist is formed on all surfaces and then patterned. Finally, as shown in FIG. 9D, etching is performed so as to obtain a wiring pattern 91 of the desired configuration.

Additionally, to increase airtightness within the hollow portion 5 with respect to formation of the via-hole 16, a bonding agent 17 is disposed within the via-hole 16 so as to seal airtightly.

Furthermore, the cover 43 can also be structured of metal instead of resin, if the thermal-expansion coefficient is close to that of the housing-body portion 22.

Fifth Embodiment

Figure 10:
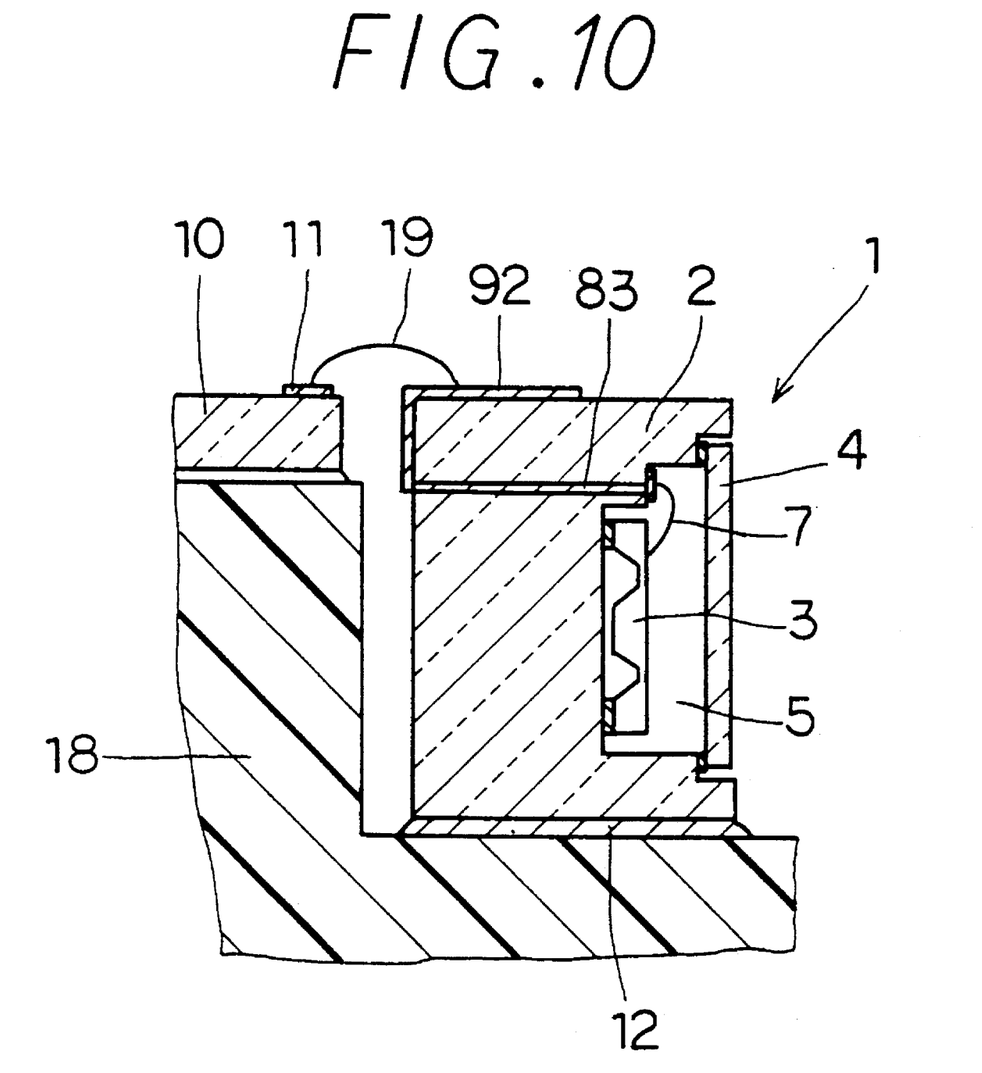
FIG. 10 is a sectional structural view indicating a fifth embodiment according to the present invention.

The present embodiment employs a resin case 18 and disposes a step in this resin case 18 so as to bond and fix the G sensor 1 on a lower-step portion of this case, as shown in FIG. 10. Additionally, the circuit board 10 is fixed to an upper-step portion of the resin case 18.

For the G sensor 1, wiring leads 83 and 92 is formed on an upper side thereof, and the G sensor 1 is electrically connected to the circuit board 10 by wire bonding with a wire 19.

By being formed in this manner, the G sensor 1 and the circuit board 10 can be formed in substantially the same plane.

Moreover, a cover formed of metal, resin, or the like was described in the foregoing third through fifth embodiments, but structuring by ceramic or the like is also acceptable.

Sixth Embodiment

Figure 11A:
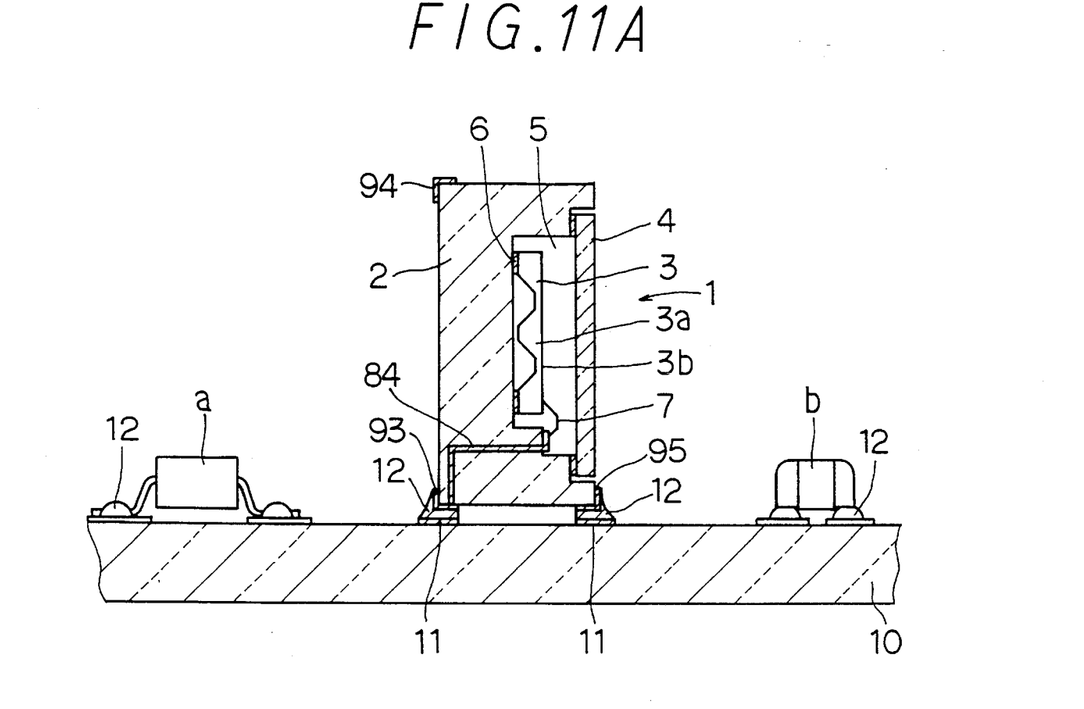
FIGS. 11A and 11B are sectional structural views indicating a sixth embodiment according to the present invention, wherein FIG. 11A indicates a state wherein a G sensor is fixed perpendicularly to a circuit board, and FIG. 11B indicates a state wherein the G sensor is fixed horizontally to the circuit board.
Figure 11B:
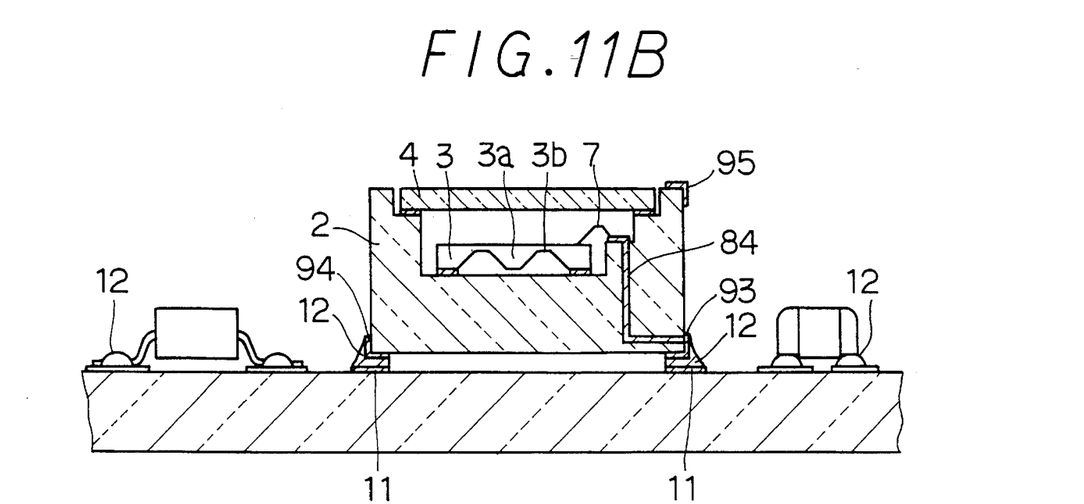
Figure 12A:
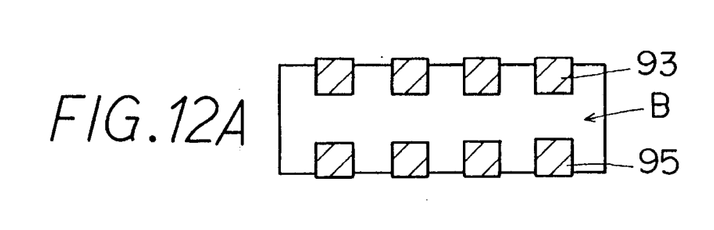
FIG. 12A is a top view.
Figure 12B:
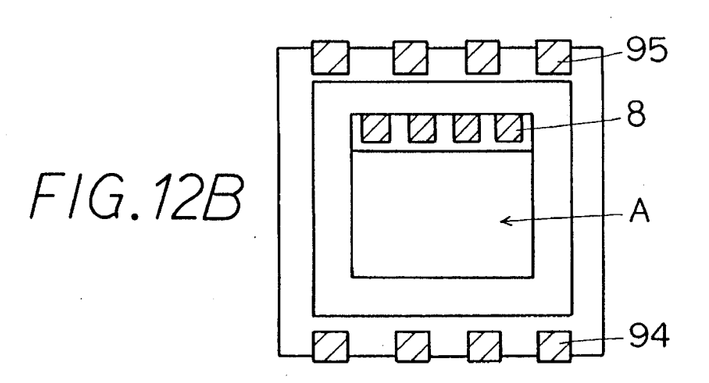
FIG. 12B is a front view.
Figure 12C:
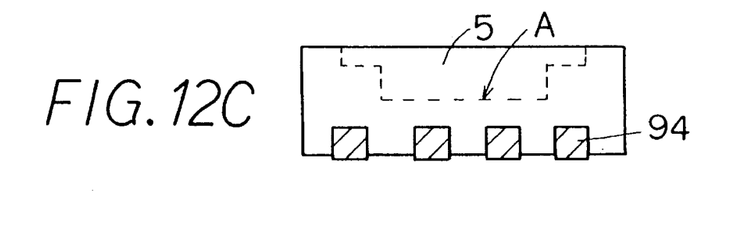
FIG. 12C is a bottom view.
Figure 12D:
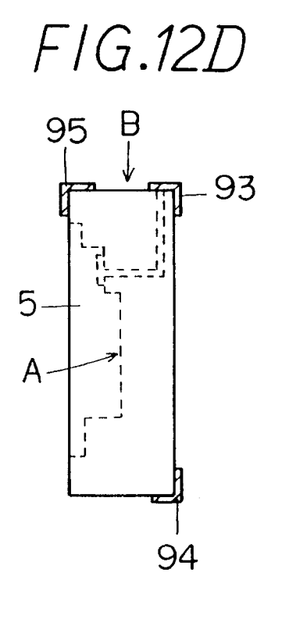
FIG. 12D is a side view.
Figure 12E:
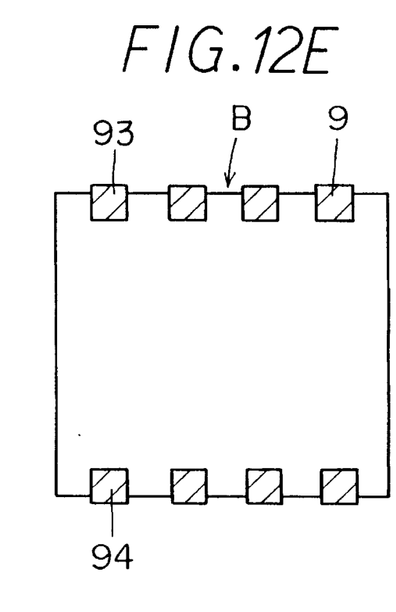
FIG. 12E is a rear view.

FIGS. 11A and 11B indicate sectional side structural views of a G sensor 1 of the present embodiment.

The G sensor 1 is structured from a housing-body portion 2, sensor chip 3, cover 4, and the like and, as shown in FIG. 11A or 11B, is mounted perpendicularly or horizontally with respect to a circuit board 10. On the circuit board 10, other circuit elements a and b are mounted.

On the circuit board 10, the G sensor 1 and circuit elements a and b, all of which make up an ECU and the like, are mounted simultaneously by causing a bonding agent 12, such as solder, silver paste, or the like, to reflow. Herein, the wiring lead 93, 94, or 95 formed on the housing-body portion 2 and wiring 11 (circuit wiring connected to the foregoing circuit elements a and b) formed on the circuit board 10 are electrically connected via the bonding agent 12 so that the G sensor 1 is face-down bonded to the circuit board 10. Consequently, the G sensor 1 becomes electrically and mechanically connected to the circuit board 10 by the bonding agent 12.

When the circuit board 10 mounted with the G sensor 1 is installed in a plane parallel with the floor of a vehicle passenger compartment, like the foregoing various embodiments, the G sensor 1 according to the present embodiment is fixed perpendicularly to the circuit board 10 as shown in FIG. 11A. On the other hand, in a case such as wherein the circuit board 10 mounted with the G sensor 1 is installed within a steering wheel, the G sensor 1 is required to be fixed in a horizontal direction on the circuit board 10.

In this regard, according to the present embodiment, the G sensor 1 can be fixed not only perpendicularly but also horizontally with respect to the circuit board 10, enlarging the degree of freedom for installation of the G sensor 1.

For this reason, as shown in FIGS. 11A and 11B, wiring leads 93 to 95 are formed on an outer peripheral surface of the housing-body portion 2, and are electrically connected to the wiring 11 on the circuit board 10 by the wiring lead 93. In this case, because the wiring lead 93 is formed on an upper surface (i.e., the bottom surface in the installation state of FIG. 11A) and lower surface of the housing-body portion 2, the wiring lead 93 and the wiring 11 on the circuit board 10 can be electrically connected whether fixed either perpendicularly or horizontally with respect to the circuit board 10, as shown respectively in FIGS. 11A and 11B.

Furthermore, according to the present embodiment, a via-hole is formed within the housing-body portion 2 and wiring lead 84 is formed. In other respects the structure is similar to the first embodiment.

FIGS. 12A to 12E indicate a structure of the housing-body portion 2 according to the present embodiment. FIGS. 12A to 12E indicate respectively the upper surface, front surface, lower surface, side surface, and rear surface of the housing-body portion 2. As shown in these figures, the wiring leads 94 and 95 are formed with separation from the wiring lead 93. The wiring leads 93 to 95 can be formed without separation, but separation of these leads is preferred due to consideration of the durability properties of the bonding agent 12.

Additionally, the wiring leads 94 and 95 become dummy wiring with no relation to signal transmission, but even with respect to these it is also acceptable to provide the wiring lead 84 and the like to serve as signal wiring.

Moreover, according to the foregoing various embodiments, the processor circuit is not exclusively formed on a surface identical to the sensor chip 3 within the housing-body portion 2, but may acceptably be formed integrally with the sensor chip 3 or be provided on an outer peripheral surface of the housing-body portion 2. Additionally, it is also acceptable to receive signals from the sensor chip 3 and perform signal processing on the circuit board 10 side. In any of these cases, the electrical signal output externally from the housing-body portion 2 is an electrical signal, which indicates a state of displacement of a sensor chip, of the present invention.

Additionally, the foregoing embodiments described employ a strain-gauge type acceleration sensor using monocrystalline silicon, but application in a thin-film capacitor type acceleration sensor or the like employing polycrystalline silicon and so on is also possible.

Furthermore, application of the present invention in an acceleration detecting device is described, but application in another detecting device which fixes a housing substantially perpendicularly to a circuit board and disposes a sensor chip within the housing to detect force in a direction parallel to the circuit board, for example application in a pressure sensor to detect pressure, is also possible.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A physical-quantity detecting device comprising:
   a housing which is to be fixed on a circuit board, having a hollow portion;
   a sensor chip installed within said hollow portion, said sensor chip being to be subjected to force in a direction perpendicular or parallel to said circuit board to output an electrical signal in correspondence with magnitude of said force;
   said housing has a flat end face on an outer side thereof; and
   a wiring electrode for outputting said electrical signal provided so as to be drawn from a wall of said hollow portion to said flat end face penetrating the housing, said wiring electrode having a face-bonding pad region on said flat end face, wherein
   said face-bonding pad region of said wiring electrode is electrically and mechanically connected to wiring on said circuit board when said housing is fixed to the circuit board.

2. A physical-quantity detecting device according to claim 1, wherein said housing comprises:
   a mount portion for chip-support use wherein a portion on which said sensor chip is installed is parallel or perpendicular with respect to said flat end face; and
   a cover installed on an installation side of said sensor chip with respect to said mount portion, forming said hollow portion with said mount portion and airtightly sealing said hollow portion.

3. A physical-quantity detecting device according to claim 2, wherein said mount portion of said housing includes a plurality of insulating substrates which are laminated to structure a configuration thereof.

4. A physical-quantity detecting device according to claim 1, wherein said wiring electrode provided on said flat end face of said housing is bonded to said wiring of said circuit board by a conductive bonding agent.

5. A physical-quantity detecting device, comprising:
   a housing fixed on a circuit board and having a hollow portion, said housing having a first outside wall and a second outside wall;
   a sensor chip installed within said hollow portion, said sensor chip being subjected to force in a direction parallel or perpendicular to said circuit board and output an electric signal in correspondence with said force; and
   wiring means for outputting said electric signal having a pad region extendedly formed on both said first and second outside walls;
   wherein said pad region provided on one of said first and second outside wall is electrically and mechanically connected to said circuit board, and thereby said housing is fixed to said circuit board.

6. A physical quantity detecting device according to claim 5, wherein said pad region has a first portion located on said first outside wall and a second portion located on said second outside wall, one of said first and second portions of said pad region facing said circuit board.

7. An acceleration detecting device, comprising:
   a housing of a configuration having interiorly a hollow portion thereof and having a flat end face, with a sensor chip which is subjected to acceleration and is displaced installed within said hollow portion;
   electrical wiring to output an electrical signal indicating a displaced state of said sensor chip formed within this housing and on said end face;
   a circuit board formed with circuit elements which operate on a basis of said electrical signal; and
   a means for connecting to electrically and mechanically connect said end face formed with electrical wiring to said circuit board and fix said housing to said circuit board substantially perpendicularly.

8. An acceleration detecting device according to claim 6, wherein said housing is structured by:
   a substrate of planar configuration installed with said sensor chip; and
   a cover portion of a configuration having a concavity and installed on one surface of said substrate to form said hollow portion and airtightly seal said hollow portion.

9. An acceleration detecting device according to claim 7, wherein said housing is structured by:
   a housing-body portion of box configuration having a concavity in which said sensor chip is housed; and
   a cover portion installed on a surface of said concavity of this housing-body portion to form said hollow portion and airtightly seal said hollow portion.

10. An acceleration detecting device according to claim 9, wherein said cover portion is of an L-shaped configuration having a first portion installed on an entire surface of said concavity and a second portion formed on an identical surface as said end face, and said means for connecting connects said housing end face and said second portion to said circuit board.

11. An acceleration detecting device according to claim 6, wherein said housing is formed by laminating a plurality of insulating substrates.

12. An acceleration detecting device according to claim 7, wherein said means for connecting is a conductive bonding agent.

13. An acceleration detecting device according to claim 8, wherein said means for connecting is a conductive bonding agent.

14. An acceleration detecting device according to claim 7, wherein said means for connecting is a conductive bonding agent.

15. An acceleration detecting device according to claim 10, wherein said means for connecting is a conductive bonding agent.

16. An acceleration detecting device, comprising:
   a housing-body portion having a concavity of box configuration, a sensor chip which is subjected to acceleration and is displaced being installed within said concavity;
   a cover portion installed on said concavity of this housing-body portion to form a hollow portion in which said sensor chip is housed and airtightly seal said hollow portion;
   electrical wiring to output an electrical signal indicating a displaced state of said sensor chip, said electrical wiring being formed within this housing-body portion, on a first outer peripheral surface of said housing-body portion and on a second outer peripheral surface perpendicularly intersecting said first outer peripheral surface;
   a circuit board formed with circuit elements which operate on a basis of said electrical signal; and
   a means for connecting to electrically and mechanically connects one of said first and second outer peripheral surfaces to said circuit board and fix said housing-body portion to said circuit board.

17. An acceleration detecting device according to claim 16, wherein said housing-body portion is formed by laminating a plurality of insulating substrates.

18. An acceleration detecting device according to claim 16, wherein said means for connecting is a conductive bonding agent.

19. An acceleration detecting device, comprising:

a housing of a configuration having interiorly a hollow portion and having exteriorly a flat end face, with a sensor chip which is subjected to acceleration and is displaced installed within said hollow portion;

electrical wiring to output an electrical signal indicating a displaced state of said sensor chip formed within this housing and on a peripheral portion of said housing;

a circuit board having circuit elements which operate on a basis of said electrical signal and which is formed with circuit wiring connected to said circuit elements;

a means for wiring to electrically connect said electrical wiring and said circuit wiring; and a means for connecting to connect an end face of said housing to said circuit board and fix said housing substantially perpendicularly.

20. An acceleration detecting device according to claim 19, further comprising a case having a step, wherein said circuit board is installed on an upper-step portion of said step, said housing is fixed on a lower-step portion, and said housing and said circuit board are formed in a substantially identical plane.

* * * * *